United States Patent
Grado et al.

(10) Patent No.: US 6,777,950 B2
(45) Date of Patent: Aug. 17, 2004

(54) SYSTEM AND METHOD FOR VERIFYING WIRE HARNESS CONNECTIONS IN A FUEL INJECTOR ASSEMBLY

(75) Inventors: Antonino Grado, Windsor (CA); Diane Burling-Doyle, Essex (CA); Jennifer Gryn, Amherstburg (CA)

(73) Assignee: Siemens VDO Automotive Inc., Chatham, CA (US)

( * ) Notice: Subject to any disclaimer, the term of this patent is extended or adjusted under 35 U.S.C. 154(b) by 147 days.

(21) Appl. No.: 09/982,058

(22) Filed: Oct. 18, 2001

(65) Prior Publication Data

US 2002/0046598 A1 Apr. 25, 2002

Related U.S. Application Data

(60) Provisional application No. 60/243,180, filed on Oct. 25, 2000.

(51) Int. Cl.[7] .................. G01R 31/00; H01H 31/04; H01H 31/02
(52) U.S. Cl. .............. 324/503; 324/538; 324/555; 73/118.1
(58) Field of Search .............. 73/118.1, 821, 73/862.01, 826, 834, 865.9; 324/503, 538, 772, 555, 556

(56) References Cited

U.S. PATENT DOCUMENTS

| | | | | |
|---|---|---|---|---|
| 2,782,635 A | * | 2/1957 | Knight | 73/828 |
| 6,014,901 A | | 1/2000 | Boe | 73/831 |
| 6,079,259 A | | 6/2000 | Starman | 73/118.1 |

* cited by examiner

*Primary Examiner*—N. Le
*Assistant Examiner*—Donald M Lair

(57) ABSTRACT

A system and method for testing whether proper connections (30, 34) are made between wire harnesses and fuel injector assemblies (26) includes at least one gripper mechanism (44) for grasping a selected portion (32, 36) of a wire harness associated with the fuel injector assembly (26). The gripper mechanism (44) preferably moves relative to the fuel injector assembly after it has been positioned on an appropriate support (40). The gripper mechanism (44) preferably grasps a selected portion (32, 36) of the wire harness and pulls it in a direction away from the fuel injector assembly (26). If a proper connection is made, the wire harness does not become disconnected from the fuel injector assembly. If a proper connection is not made, however, that is revealed as the gripper mechanism (44) pulls the wire harness off of the fuel injector assembly.

11 Claims, 1 Drawing Sheet

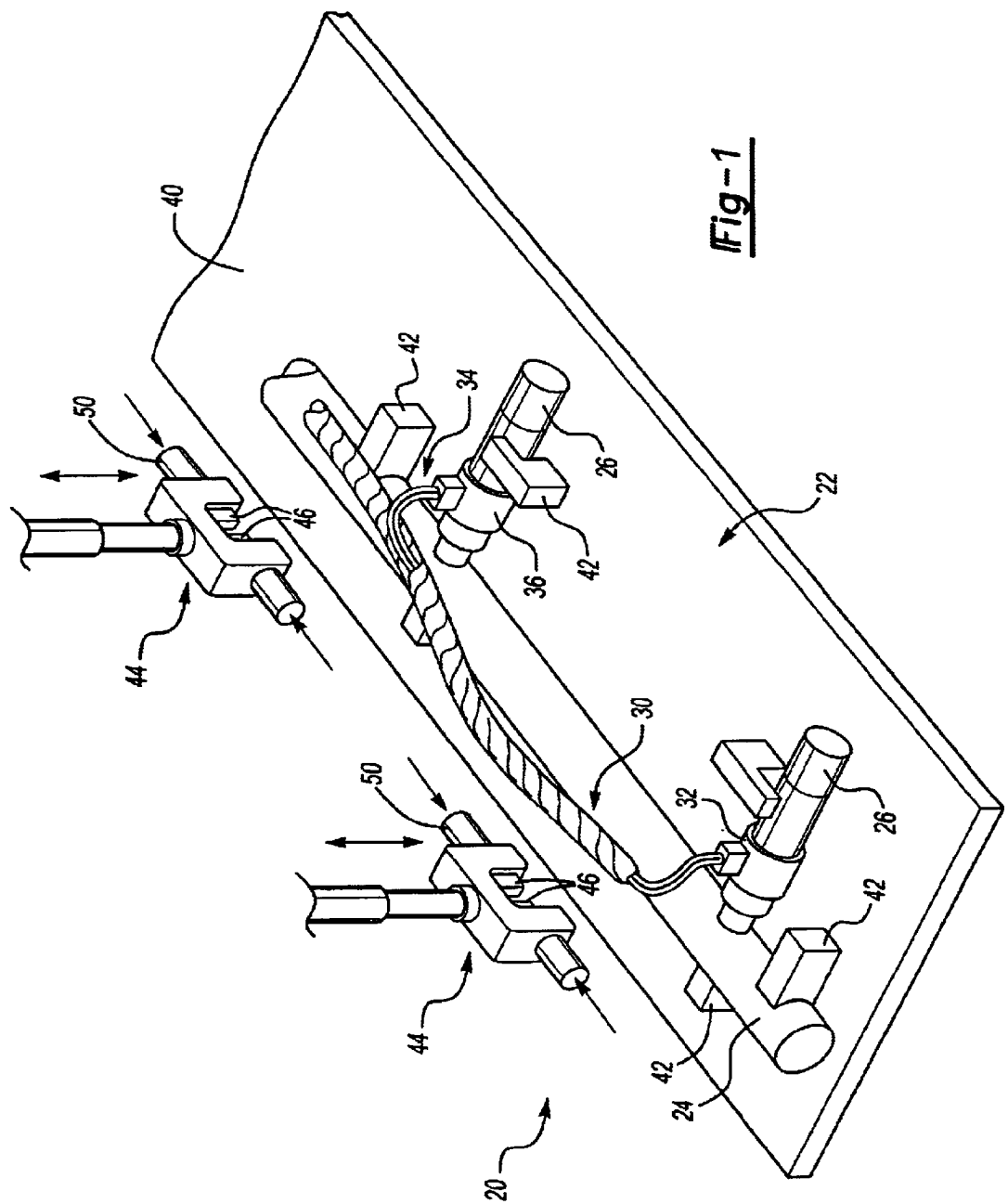

SYSTEM AND METHOD FOR VERIFYING WIRE HARNESS CONNECTIONS IN A FUEL INJECTOR ASSEMBLY

CROSS REFERENCE TO RELATED APPLICATIONS

This application claims priority to U.S. Provisional Application No. 60/243,180, which was filed on Oct. 25, 2000.

BACKGROUND OF THE INVENTION

This invention generally relates to assembling wire harnesses and fuel injector assemblies. More particularly, this invention relates to a system and method for verifying proper connections between wire harnesses and fuel injector assemblies.

Modern day vehicles typically include fuel injector assemblies. Typical fuel injector assemblies include interfaces for making connections with other vehicle components so that electrical signals can be communicated between the fuel injector assemblies and the other components. Typical arrangements include wire harnesses that are coupled to the fuel injector assembly during production.

A common method of testing whether the wire harness connection is made is to conduct a continuity test, which provides an indication if the electrical leads are touching so that electrical signals can be communicated between a fuel injector assembly and the other devices on the vehicle. While these continuity tests provide information regarding electrical contact, they do not provide an indication of how secure the wire harness connection is.

There is a need for an improved testing approach that not only verifies electrical continuity but also ensures proper physical connection between the wire harness and the fuel injector assembly. Without a proper physical connection, even though electrical continuity may be established during the manufacturing or initial assembly process, at some later time, the physical connection between the wire harness and the fuel injector assembly may fail.

This invention provides an improved testing system for verifying proper connections between wire harnesses and fuel injector assemblies.

SUMMARY OF THE INVENTION

In general terms, this invention is a system for verifying physical connections between wire harnesses and fuel injector assemblies. A system designed according to this invention includes at least one gripper mechanism that moves into a position to grasp a connector between a wire harness and a fuel injector assembly. The gripper mechanism lightly pulls on the connector. If a proper connection is made, the connector remains in place. If the motion of the gripper results in the connector coming off, then the assembly is rejected.

The various features and advantages of this invention will become apparent to those skilled in the art from the following detailed description of the currently preferred embodiment. The drawing that accompanies the detailed description can be briefly described as follows.

BRIEF DESCRIPTION OF THE DRAWING

The FIGURE schematically illustrates a system designed according to this invention.

DETAILED DESCRIPTION OF THE PREFERRED EMBODIMENT

The FIGURE schematically illustrates a system 20 for verifying the integrity of physical connections between a fuel injector assembly and wire harnesses. A fuel injector manifold 22 includes a fuel rail 24 plurality of fuel injectors 26 with terminals for making electrical connections as known in the art. A first wire harness connection 30 has a connector portion 32 that is coupled to an interface of a corresponding fuel injector 26. A second wire harness connection 34 has a connector portion 36 that is coupled with another fuel injector 26. Although two wire harness connections 30 and 34 are illustrated, those skilled in the art will appreciate that this invention is useful for fuel injector assemblies where more or at least one wire harness connection is made to the fuel injector assembly.

The illustrated arrangement includes a support portion 40 for supporting the fuel injector manifold 22 during a testing procedure. A plurality of holding members 42 secure the manifold 22 in place on the support 40. The securing portions 42 may be moveable or fixed on the support 30 depending on the needs of a particular situation. In one example, openings (not illustrated) are provided in the support 40 through which at least a portion of the injectors 26 are received when the fuel rail 24 is positioned on the support 40.

Gripper mechanisms 44 preferably move into position relative to the manifold 22 once it is appropriately positioned on the support 40. Gripping surfaces 46 preferably are moveable relative to each other so they can engage the wire harness connector portions 32 and 36, respectively. The gripper mechanisms 44 then preferably exert a pulling force on the wire harness connections in a direction away from the manifold 22. This pulling force preferably is sufficient enough to reveal when a proper mechanical connection has not been established between the connector portion and the associated interface on the fuel injector assembly. The pulling force preferably is not so great that it will overcome an appropriately made connection. Given this description, those skilled in the art will be able to determine the appropriate pulling force to conduct a reliable test based upon the particular configuration, material strengths and arrangement of their own situation.

In the event that one or more of the wire harness connections is pulled away from the manifold as a result of the movement of the gripper mechanism, then the fuel injector assembly is rejected because a proper mechanical connection is not established at all necessary interfaces.

When an injector manifold 22 passes the connection test, it is desirable to mark the assembly with a visible marking indicating that the connections are satisfactory. In one example, a colored spot is placed onto a selected portion of the manifold 22.

An electrical continuity test, as known in the art, is optionally conducted before the mechanical connection test is completed as described above using the gripper mechanisms 34. The preferred embodiment includes performing an electrical continuity test after the gripper test has been completed. The latter electrical continuity test ensures that proper electrical signal communication will be facilitated and ensures that the gripper test did not interfere with a proper electrical connection.

In at least one example, the connector portions 32 and 36 include clips as known in the art. Such clip arrangements sometimes include a locking tab for securing the clip in place on the injector assembly. In the illustrated example, the gripper mechanisms 44 include a locking surface 50 that is adapted to engage the locking tabs on the clip of the connector portions. The gripper mechanisms 44 preferably are moved into position to engage the connector portions such that the locking surfaces 50 urge the locking clips into a locked position.

The preceding description is exemplary rather than limiting in nature. Variations and modifications to the disclosed embodiment may become apparent to those skilled in the art that do not necessarily depart from the essence of this invention. The scope of legal protection given to this invention can only be determined by studying the following claims.

The following is claimed:

1. A system for checking the integrity of physical connections between a fuel injector assembly and at least one associated wire harness, comprising:
   a support portion for supporting the fuel injector assembly; and
   at least one automatic gripper mechanism that moves relative to the fuel injector assembly on the support portion, automatically grasps a selected portion of the wire harness and automatically pulls the wire harness in a direction away from the fuel injector assembly to thereby reveal whether a proper mechanical connection between the wire harness and the fuel injector assembly is established.

2. The system of claim 1, including a plurality of gripper mechanisms, the number of gripper mechanisms corresponding to a number of wire harness connections required for the fuel injector assembly.

3. The system of claim 1, including a plurality of holding members associated with the support portion to hold the fuel injector assembly in place.

4. The system of claim 1, wherein the physical connections include a plurality of clips associated with the wire harness, each clip being adapted to engage a corresponding portion on a corresponding fuel injector and wherein the gripping mechanism engages the clip.

5. The system of claim 4, wherein each clip includes a locking member and wherein the gripper mechanism includes a locking surface adapted to urge the locking member into a locked position.

6. The system of claim 1, wherein the gripper mechanism is automated such char the gripper mechanism automatically moves, grasps and pulls.

7. A method of determining whether a physical connection between a wire harness and a fuel injector assembly is secure, comprising the steps of:
   placing the fuel injector assembly in a secure position;
   automatically grasping a selected portion of at least one wire harness associated with the fuel injector assembly, using an automated gripper mechanism; and
   automatically pulling the wire harness in a direction away from the fuel injector assembly, using the gripper mechanism, to thereby reveal whether a paper physical connection between the wire harness and the fuel injector assembly has been made.

8. The method of claim 7, including rejecting an assembly when the step of pulling on the wire harness reveals that a proper physical connection has not been made.

9. The method of claim 7, including conducting an electrical continuity test after performing the step of pulling on the wire harness.

10. The method of claim 7, including marking the assembly when a proper physical connection has been verified.

11. The method of claim 7, including using the gripper mechanism to urge a locking member of a clip associated with the wire harness into a locked position.

\* \* \* \* \*